(12) United States Patent
Kim et al.

(10) Patent No.: US 9,362,449 B2
(45) Date of Patent: Jun. 7, 2016

(54) HIGH EFFICIENCY LIGHT EMITTING DIODE AND METHOD OF FABRICATING THE SAME

(71) Applicant: SEOUL VIOSYS CO., LTD., Ansan-si (KR)

(72) Inventors: Chang Yeon Kim, Ansan-si (KR); Dae Sung Cho, Ansan-si (KR); Ki Bum Nam, Ansan-si (KR); Young Wug Kim, Ansan-si (KR); Jong Kyun You, Ansan-si (KR); Kenji Shimoyama, Ushiku (JP); Takahide Joichi, Ushiku (JP); Kaori Kurihara, Ushiku (JP)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 14/464,179

(22) Filed: Aug. 20, 2014

(65) Prior Publication Data

US 2014/0353582 A1  Dec. 4, 2014

Related U.S. Application Data

(63) Continuation of application No. PCT/KR2013/001259, filed on Feb. 18, 2013.

(30) Foreign Application Priority Data

Feb. 20, 2012  (KR) .................. 10-2012-0016999
Feb. 15, 2013  (KR) .................. 10-2013-0016305

(51) Int. Cl.
*H01L 33/00* (2010.01)
*H01L 33/22* (2010.01)
(Continued)

(52) U.S. Cl.
CPC ............ *H01L 33/20* (2013.01); *H01L 33/0075* (2013.01); *H01L 33/0079* (2013.01); *H01L 33/22* (2013.01); *H01L 33/387* (2013.01); *H01L 33/44* (2013.01)

(58) Field of Classification Search
CPC . H01L 33/06; H01L 33/0025; H01L 33/0079; H01L 33/22; H01L 33/32; H01L 33/60; H01L 33/0058; H01L 33/0075
USPC .............................................. 257/13; 438/17
See application file for complete search history.

(56) References Cited

U.S. PATENT DOCUMENTS 7,859,007 B2   12/2010   Hirayama et al.
7,943,943 B2    5/2011   Hirayama et al.
(Continued)

FOREIGN PATENT DOCUMENTS

JP   2005-101533    4/2005
JP   2007-173579    7/2007
(Continued)

OTHER PUBLICATIONS

U.S. Appl. No. 14/582,591, filed Dec. 24, 2014, Kurihara, et al.
(Continued)

*Primary Examiner* — Christine Enad
(74) *Attorney, Agent, or Firm* — Oblon, McClelland, Maier & Neustadt, L.L.P.

(57) ABSTRACT

Disclosed herein are a high efficiency light emitting diode and a method of fabricating the same. The light emitting diode includes a semiconductor stacked structure disposed on the support substrate and including a gallium nitride-based p-type semiconductor layer, a gallium nitride-based active layer, and a gallium nitride-based n-type semiconductor layer; and a reflecting layer disposed between the support substrate and the semiconductor stacked structure, wherein the semiconductor stacked structure includes a plurality of protrusions having a truncated cone shape and fine cones formed on top surfaces of the protrusions. By this configuration, light extraction efficiency of the semiconductor stacked structure having low dislocation density can be improved.

18 Claims, 16 Drawing Sheets

(51) Int. Cl.
*H01L 33/32* (2010.01)
*H01L 33/20* (2010.01)
*H01L 33/38* (2010.01)
*H01L 33/44* (2010.01)

(56) References Cited

U.S. PATENT DOCUMENTS

| | | | |
|---|---|---|---|
| 8,420,426 B2 | 4/2013 | Hirayama et al. | |
| 2005/0040414 A1 | 2/2005 | Hirayama et al. | |
| 2007/0252162 A1 | 11/2007 | Hirayama et al. | |
| 2010/0072501 A1* | 3/2010 | Wakai et al. | 257/98 |
| 2010/0163887 A1* | 7/2010 | Kim et al. | 257/76 |
| 2011/0201142 A1 | 8/2011 | Hirayama et al. | |
| 2012/0012984 A1* | 1/2012 | Shimodaira | C30B 9/10 257/615 |
| 2012/0119243 A1* | 5/2012 | Kim et al. | 257/98 |
| 2012/0126198 A1* | 5/2012 | Nakamura et al. | 257/9 |
| 2012/0138985 A1* | 6/2012 | Ono et al. | 257/98 |
| 2012/0214267 A1* | 8/2012 | Wang et al. | 438/29 |
| 2013/0161643 A1* | 6/2013 | Crowder et al. | 257/77 |

FOREIGN PATENT DOCUMENTS

| | | |
|---|---|---|
| JP | 2009-130027 | 6/2009 |
| JP | 2010-045289 | 2/2010 |
| JP | 2011-243956 | 12/2011 |

OTHER PUBLICATIONS

International Search Report issued Jun. 27, 2013 in PCT/KR2013/001259 filed Feb. 18, 2013.
International Preliminary Report on Patentability issued Aug. 26, 2014 in PCT/KR2013/001259.
Written Opinion of the International Searching Authority issued Jun. 27, 2013 in PCT/KR2013/001259.

* cited by examiner (a)

(b)

(c)

HIGH EFFICIENCY LIGHT EMITTING DIODE AND METHOD OF FABRICATING THE SAME

This is a continuation of International Application PCT/KR2013/001259, filed on Feb. 18, 2013, and designated the U.S., and claims priority from Korean Patent Application 10-2012-0016999 which was filed on Feb. 20, 2012 and Korean Patent Application 10-2013-0016305 which was filed on Feb. 15, 2013, the entire contents of which are incorporated herein by reference.

TECHNICAL FIELD

The present invention relates to a light emitting diode and a method of fabricating the same, and more particular, to a high efficiency light emitting diode using a gallium nitride substrate as a growth substrate and a method of fabricating the same.

BACKGROUND ART

Generally, nitrides of group III elements such as gallium nitride (GaN), aluminum nitride (AlN), and the like, have excellent thermal stability and a direct transition energy band structure and therefore, have greatly become of interest as materials for a light emitting device of visible and ultraviolet regions. In particular, blue and green light emitting devices using indium gallium nitride have been used for various applications, such as a large-scale full color flat panel display, a traffic light, indoor illumination, a high-density light source, a high resolution output system, optical communication, and the like.

A nitride semiconductor layer of the group III elements has been grown on a heterogeneous substrate having a similar crystalline structure by processes, such as metal organic chemical vapor deposition (MOCVD), molecular beam epitaxy (MBE), and the like, since it is difficult to fabricate a homogeneous substrate on which the nitride semiconductor layer may be grown. A sapphire substrate having a hexagonal structure as a heterogeneous substrate has been mainly used. Recently, a technology of fabricating a high efficiency light emitting diode having a vertical structure by growing epitaxial layers such as a nitride semiconductor layer on a heterogeneous substrate such as sapphire, bonding a support substrate to the epitaxial layers, and separating the heterogeneous substrate using a laser lift off technology, and the like, has been developed. The heterogeneous substrate such as sapphire and the epitaxial layer grown thereon have different physical properties and therefore, the growth substrate can be easily separated using an interface therebetween.

However, the epitaxial layer grown on the heterogeneous substrate has a relatively high dislocation density due to a lattice mismatch and a difference in thermal expansion coefficients with the growth substrate. It has been known that the epitaxial layers grown on the sapphire substrate generally has the dislocation density of $1E8/cm^2$ or more. The epitaxial layer having the high dislocation density has a limitation in improving emission efficiency of the light emitting diode.

Further, since the entire thickness of the epitaxial layer is very thin at several micrometers as compared with an emission area of, for example, 350 μm×350 μm or 1 mm², it is difficult to spread current. Further, as compared with the case in which the light emitting diode is operated at high current with the case in which the light emitting diode is operated at low current, current is concentrated at the dislocation, which leads to a droop phenomenon of reducing internal quantum efficiency.

SUMMARY OF THE INVENTION

An object of the present invention is to provide a high efficiency light emitting diode having a vertical structure.

Another object of the present invention is to provide a high efficiency light emitting diode capable of reducing a droop.

Another object of the present invention is to provide a high efficiency light emitting diode with improved current dispersion performance.

Still another object of the present invention is to provide a high efficiency light emitting diode with improved light extraction efficiency.

The present invention provides a high efficiency light emitting diode and a method of fabricating the same. According to an exemplary embodiment of the present invention, there is provided a light emitting diode, including: a support substrate; a semiconductor stacked structure disposed on the support substrate and including a gallium nitride-based p-type semiconductor layer, a gallium nitride-based active layer, and a gallium nitride-based n-type semiconductor layer; and a reflecting layer disposed between the support substrate and the semiconductor stacked structure, wherein the semiconductor stacked structure includes a plurality of protrusions having a truncated cone shape and fine cones formed on top surfaces of the protrusions.

Alternatively, instead of the protrusions having a truncated cone shape, the semiconductor stacked structure includes a plurality of recesses spaced apart from one another and fine cones formed on surfaces of protruding portion between the recesses.

The semiconductor stacked structure may be formed to have a dislocation density of $5\times10^6/cm^2$ or less. The light emitting diode represents a droop less than 20% at 350 mA by low dislocation density and crystalline quality of semiconductor layers. The semiconductor stacked structure may be formed of semiconductor layers grown on a gallium nitride substrate.

The protrusions may be arranged in a honeycomb shape. The protrusions having the truncated cone shape may be adjacent to each other and thus, a V-shaped groove of which the bottom is sharp may be formed in a region therebetween. The bottom surfaces of the protrusions may have a hexagonal shape.

An average height of the protrusions may exceed 3 μm and an average height of the fine cones may be 1 μm or less. The fine cones may be disposed only on the top surfaces of the protrusions.

According to another exemplary embodiment of the present invention, there is provided a light emitting diode, including: a support substrate; a semiconductor stacked structure disposed on the support substrate and including a gallium nitride-based p-type semiconductor layer, a gallium nitride-based active layer, and a gallium nitride-based n-type semiconductor layer; and a reflecting layer disposed between the support substrate and the semiconductor stacked structure, wherein the semiconductor stacked structure is formed to have a dislocation density of $5\times10^6/cm^2$ or less The semiconductor stacked structure may include a plurality of protrusions and fine cones formed on top surfaces of the protrusions.

According to another exemplary embodiment of the present invention, there is provided a method of fabricating a light emitting diode, including: forming a semiconductor stacked structure by growing semiconductor layers including a gallium nitride-based n-type semiconductor layer, a gallium nitride-based active layer, and a gallium nitride-based p-type semiconductor layer on a gallium nitride substrate; forming a support substrate on the semiconductor stacked structure; and removing the gallium nitride substrate.

The method may further include: forming a plurality of protrusions having fine cones by etching a surface of the semiconductor stacked structure that is exposed by removing the gallium nitride substrate, wherein the plurality of protrusions have a truncated cone shape.

The forming of the plurality of protrusions having the fine cones may include: forming a mask pattern on the surface of the semiconductor stacked structure and performing dry etching on the semiconductor stacked structure by using the mask pattern as an etch mask to form the plurality of protrusions; removing the mask pattern; and forming fine cones by performing wet etching on the top surfaces of the plurality of protrusions.

The wet etching may be performed using a boiling solution of KOH or NaOH.

A V-shaped groove of which the bottom is sharp may be formed in a region between the protrusions so that the plurality of protrusions are adjacent to each other.

The removing of the gallium nitride substrate may include: partially removing the gallium nitride substrate by grinding the gallium nitride substrate; and partially removing the gallium nitride substrate remaining on the semiconductor stacked structure by an inductively coupled plasma reactive ion etching (ICP-RIE) technology.

The method of fabricating a light emitting diode may further include: polishing the gallium nitride substrate after grinding the gallium nitride substrate, wherein the polishing includes, for example, chemical mechanical polishing.

The method of fabricating a light emitting diode may further include: performing a test to confirm whether the surface of the semiconductor stacked structure is exposed. For example, the test may be performed by measuring surface resistance of the surface of the semiconductor stacked structure.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

MODE FOR CARRYING OUT THE INVENTION

Figure 1:
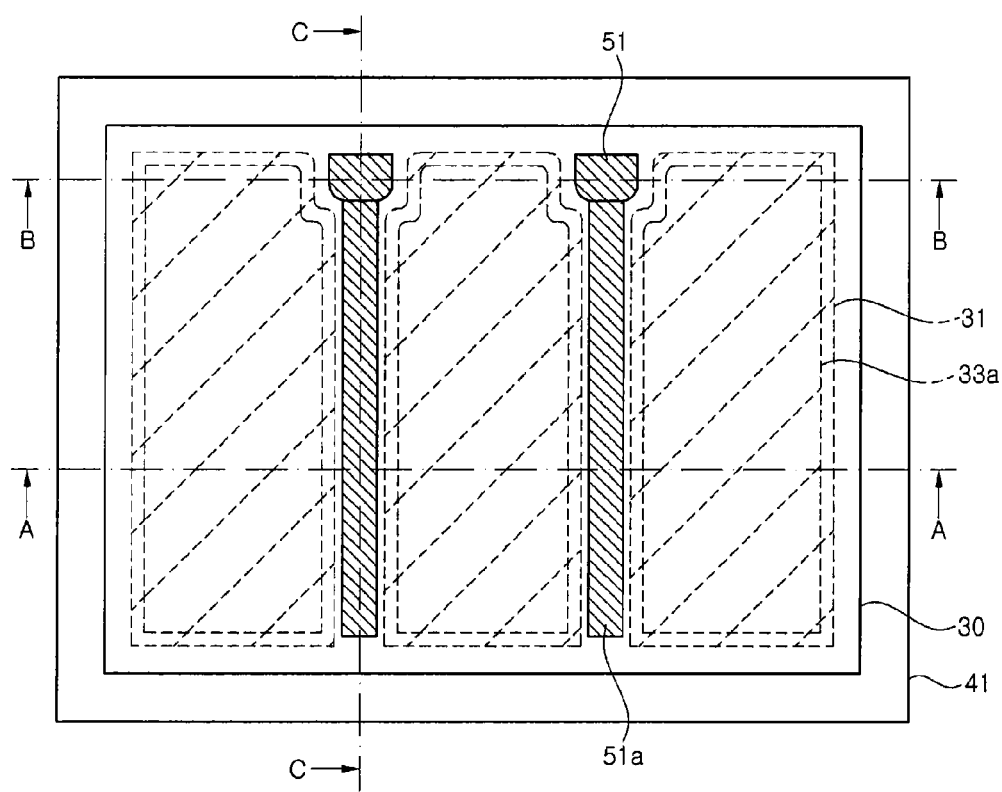
FIG. 1 is a schematic layout diagram for describing a light emitting diode according to an embodiment of the present invention.

Embodiments of the present invention will now be described in detail with reference to the accompanying drawings. These embodiments are provided so that this disclosure will be thorough and complete, and will fully convey the concept of the invention to those skilled in the art. The embodiments of the present invention may be modified in many different forms and the scope of the invention should not be limited to the embodiments set forth herein. In the drawings, the shapes and dimensions may be exaggerated for clarity, and the same reference numerals will be used throughout to designate the same or like components.

Figure 2:
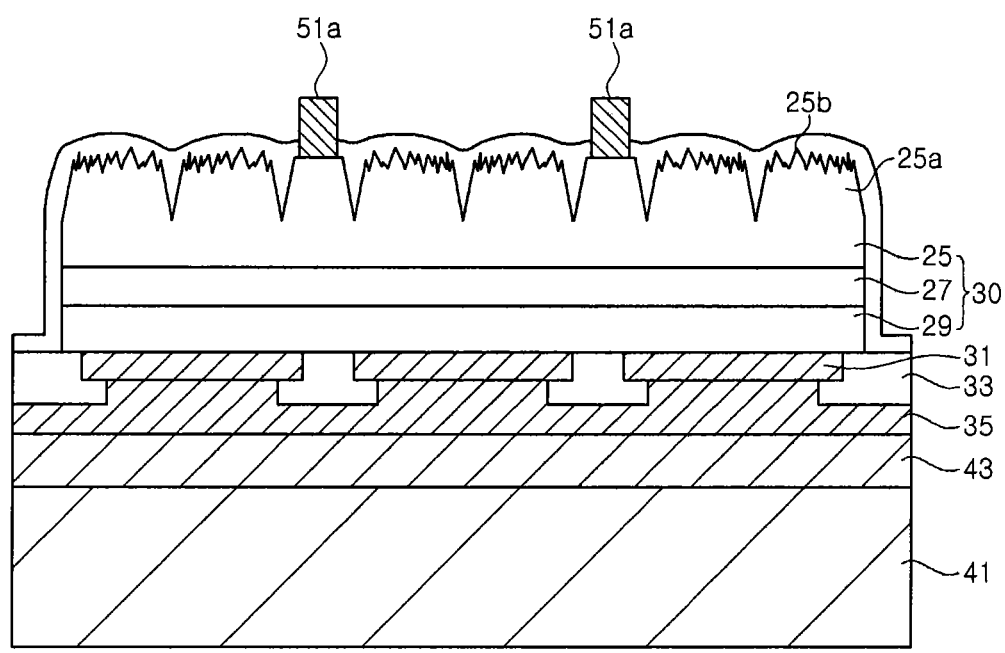
FIG. 2 is a cross-sectional view taken along the line A-A of FIG. 1 for describing the light emitting diode according to the exemplary embodiment of the present invention.
Figure 3:
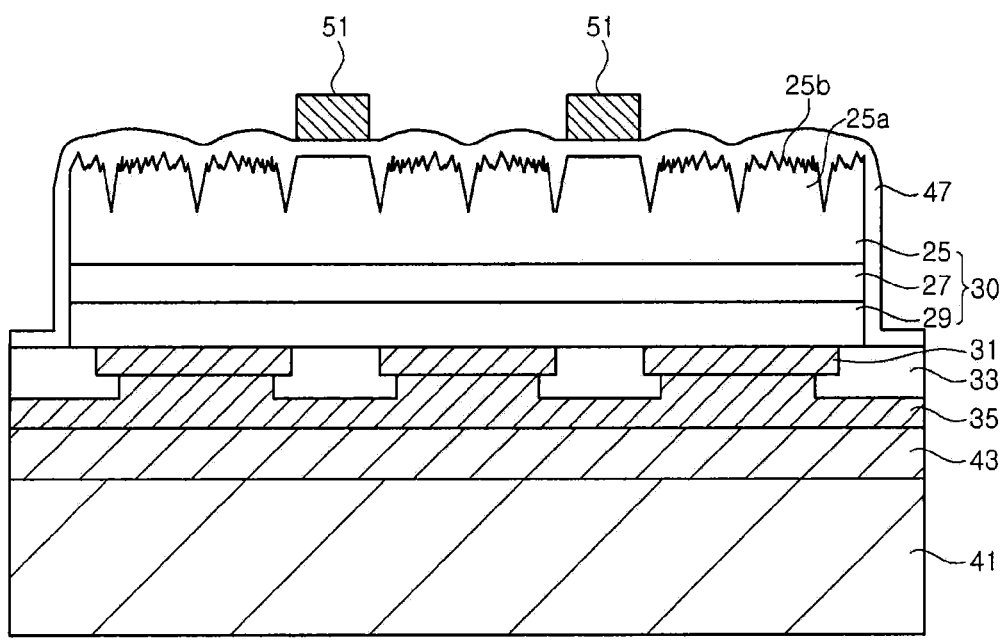
FIG. 3 is a cross-sectional view taken along the line B-B of FIG. 1 for describing the light emitting diode according to the exemplary embodiment of the present invention.
Figure 4:
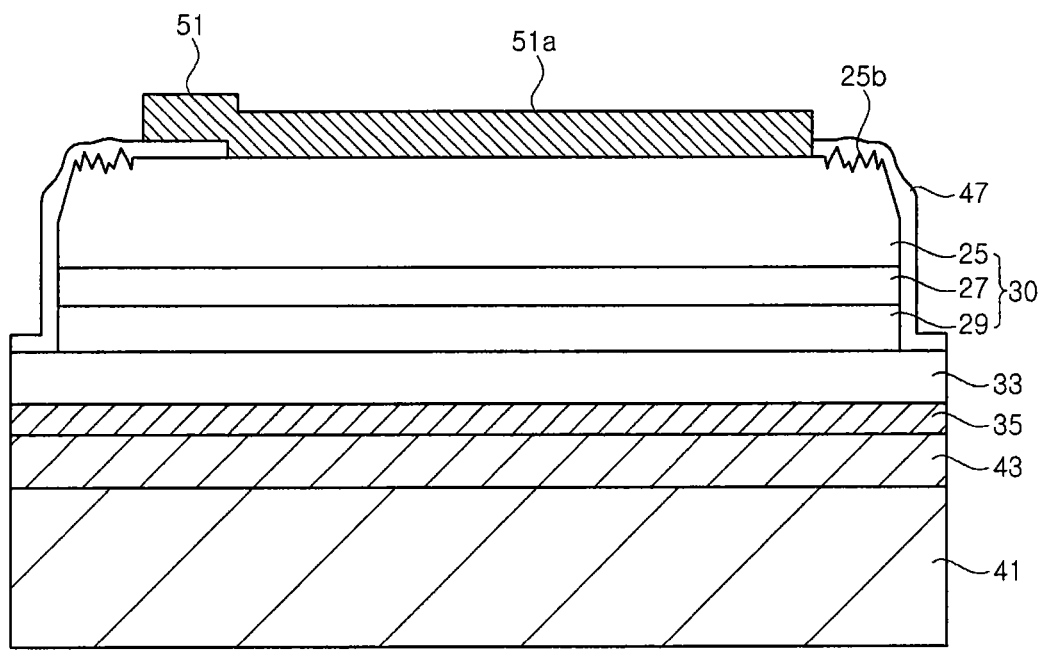
FIG. 4 is a cross-sectional view taken along the line C-C of FIG. 1 for describing the light emitting diode according to the exemplary embodiment of the present invention.

FIG. 1 is a schematic layout diagram for describing a light emitting diode according to an embodiment of the present invention and FIGS. 2 to 4 are a cross-sectional view taken along the lines A-A, B-B, and C-C of FIG. 1 for describing the light emitting diode according to the exemplary embodiment of the present invention. In FIG. 1, a reflective metal layer 31 and an intermediate insulating layer 33 that are disposed below a semiconductor stacked structure 30 are represented by a dotted line.

Referring to FIGS. 1 to 4, the light emitting diode is configured to include a support substrate 41, a semiconductor stacked structure 30, a reflective metal layer 31, an intermediate insulating layer 33, a barrier metal layer 35, a top insulating layer 47, n-electrode pads 51, and electrode extensions 51a. Further, the light emitting diode may include a bonding metal 43.

The support substrate 41 is differentiated from a growth substrate for growing compound semiconductor layers and is a secondary substrate that is attached to the compound semiconductor layers grown in already. The support substrate 41 may be a conductive substrate, for example, a metal substrate or a semiconductor substrate.

The semiconductor stacked structure 30 is disposed on the support substrate 41 and includes a p-type compound semiconductor layer 29, an active layer 27, and an n-type compound semiconductor layer 25. In the semiconductor stacked structure 30, the p-type compound semiconductor layer 29 is disposed so as to be closer to the support substrate 41 than the n-type compound semiconductor layer 25. The semiconductor stacked structure 30 may be partially disposed over a region of the support substrate 41. That is, the support substrate 41 has an area relatively wider than that of the semiconductor stacked structure 30, wherein the semiconductor stacked structure 30 is disposed within a region enclosed with edges of the support substrate 41.

The n-type compound semiconductor layer 25, the active layer 27, and the p-type compound semiconductor layer 29 may be made of III-N based compound semiconductors, for example, (Al, Ga, In) N semiconductor. The n-type compound semiconductor layer 25 and the p-type compound semiconductor layer 29 may each be formed in a single layer or a multilayer. For example, the n-type compound semiconductor layer 25 and/or the p-type compound semiconductor layer 29 may include a contact layer and a clad layer and further include a super lattice layer. In addition, the active layer 27 may be formed in a single quantum well structure or a multi quantum well structure.

The semiconductor stacked structure 30 may be formed to have dislocation density of $5 \times 10^6/cm^2$ or less. The semiconductor layers grown on the sapphire substrate generally have high dislocation density of $1 \times 10^8/cm^2$ or more. On the other hand, the semiconductor stacked structure 30 according to the exemplary embodiment of the present invention uses the semiconductor layers 25, 27, and 29 grown using the gallium nitride substrate as the growth substrate and thus, may be formed to have low dislocation density of $5 \times 10^6/cm^2$ or less. A lower bound of the dislocation density is not particularly limited, but may be set to be $1 \times 10^4/cm^2$ or more or $1 \times 10^6/cm^2$ or more. A droop occurring with an increase in current can be reduced by lowering the dislocation density within the semiconductor stacked structure 30.

A p-electrode is disposed between the p-type compound semiconductor layer 29 and the support substrate 41 and may include the reflective metal layer 31 and the barrier metal layer 35. The reflective metal layer 31 may ohmic-contact the p-type compound semiconductor layer 29 between the semiconductor stacked structure 30 and the support substrate 41. The reflective metal layer 31 may include a reflecting layer that is made of, for example, Ag. The reflective metal layer 31 is disposed only below the region of the semiconductor stacked structure 30. As shown in FIG. 1, the reflective metal layer 31 may be formed of a plurality of plates between which grooves are formed. The semiconductor stacked structure 30 is exposed through the grooves.

The intermediate insulating layer 33 covers the reflective metal layer 31 between the reflective metal layer 31 and the support substrate 41. The intermediate insulating layer 33 covers the reflective metal layer 31, for example, sides and edges of the plurality of plates and has openings that expose the reflective metal layer 31. The intermediate insulating layer 33 may be formed of a single layer or a multilayer of a silicon oxide layer or a silicon nitride layer. Further, the intermediate insulating layer 33 may be insulating layers having different refractive indexes, for example, a distribution Bragg reflector in which $SiO_2/TiO_2$ or $SiO_2/Nb_2O_5$ are repeatedly stacked. It is possible to prevent a side of the reflective metal layer 31 from being exposed to the outside by the intermediate insulating layer 33. The intermediate insulating layer 33 may also be disposed below the side of the semiconductor stacked structure 30, which can prevent current from being leaked through the side of the semiconductor stacked structure 30.

The barrier metal layer 35 covers a bottom portion of the intermediate insulating layer 33 and is connected to the reflective metal layer 31 through openings of the intermediate insulating layer 33. The barrier metal layer 35 prevents metal materials, for example, Ag of the reflective metal layer 31 from being diffused to protect the reflective metal layer 31. The barrier metal layer 35 may include, for example, an Ni layer. The barrier metal layer 35 may be disposed on a front surface of the support substrate 41.

Meanwhile, the support substrate 41 may be bonded to the barrier metal layer 35 through a bonding metal 43. The bonding metal 43 may be formed by eutectic bonding using, for example, Au—Sn. Unlike this, the support substrate 41 may also be formed over the barrier metal layer 35 by, for example, a plating technology. When the support substrate 41 is the conductive substrate, the support substrate 41 may serve as a p-electrode pad. Unlike this, when the support substrate 41 is the insulating substrate, the p-electrode pad may be formed on the barrier metal layer 35 that is disposed over the support substrate 41.

Meanwhile, a top surface of the semiconductor stacked structure 30, that is, a surface of the n-type compound semiconductor layer 25 may have a plurality of protrusions 25a and fine cones 25b that are disposed on top surfaces of the protrusions 25a. Further, the top surface of the semiconductor stacked structure 30 may have a flat surface. As shown in FIGS. 2 to 4, n-electrode pads 51 and electrode extensions 51a may be disposed on the flat surface. As shown, the n-electrode pads 51 and the electrode extensions 51a may be disposed only on the flat surface and may have a width narrower than that of the flat surface. Therefore, it is possible to prevent the electrode pads or the electrode extensions from being stripped due to occurrence of an undercut, or the like, in the semiconductor stacked structure 30, thereby increasing reliability of the semiconductor stacked structure.

Meanwhile, the plurality of protrusions 25a may have a truncated cone shape and an average height thereof may be set to be 3 μm or more. The protrusions 25a are formed on the n-type compound semiconductor layer 25 and a thickness thereof is thinner than that of the n-type compound semiconductor layer 25. For example, the n-type compound semiconductor layer 25 may have a thickness of about 6 μm and the average height of the protrusions 25a may be within a range of 3 to 5 μm. Further, the protrusions 25a having the truncated cone shape may be adjacent to each other and a region between the protrusions 25a may form a V-shaped groove as shown. The region between the protrusions 25a is formed with the V-shaped groove, which may reduce a loss of light generated from the active layer 27 within the light emitting diode due to internal total reflection.

Figure 13:
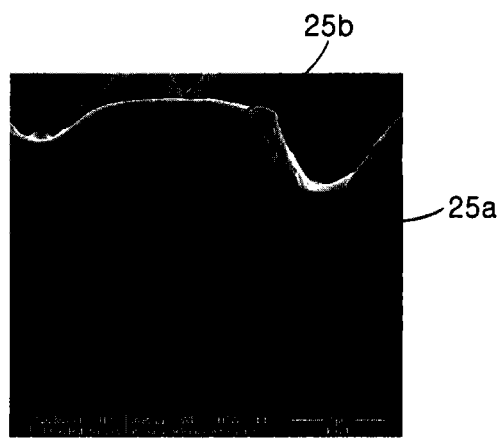
FIGS. 13 and 14 are section and plan SEM images showing protrusions and fine cones fabricated according to the exemplary embodiments of the present invention.
Figure 14:
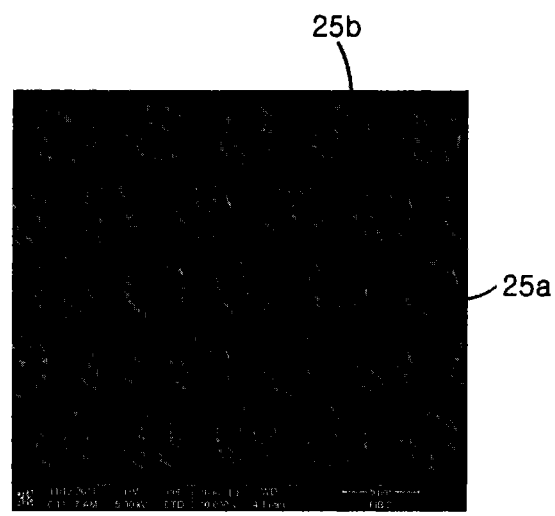

As described below, as shown in FIGS. 13 and 14, the protrusions 25a may have a truncated cone shape with a hexagonal bottom surface of and these protrusions 25a may be arranged in a honeycomb shape.

Meanwhile, the fine cones 25b are not necessarily limited thereto, but may be disposed only on the top surface of the protrusions 25a. An average height of the fine cones 25b may be set to be 1 μm and a wavelength of light generated from the active layer 25a may be preferably larger than ½. For example, when the wavelength of light is 460 nm, the average height of the fine cones 25b may be preferably larger than 230 nm.

It is possible to improve light extraction efficiency of light generated from the active layer 27 by the protrusions 25a and the fine cones 25b.

Meanwhile, the n-electrode pads 51 are disposed on the semiconductor stacked structure 30 and the electrode extensions 51a extend from the n-electrode pads 51. The plurality of n-electrode pads 51 may be disposed over the semiconductor stacked structure 30 and the electrode extensions 51a may extend from the n-electrode pads 51, respectively. The electrode extensions 51a may be electrically connected to the semiconductor stacked structure 30 and may directly contact the n-type compound semiconductor layer 25.

The n-electrode pad 51 may also be disposed over the groove region of the reflective metal layer 31. That is, the intermediate insulating layer 33 is instead disposed below the n-electrode pads 51, which do not have the reflective metal layer 31 ohmic-contacting the p-type compound semiconductor layer 29. In addition, the electrode extension 51a is disposed over the groove region of the reflective metal layer 31. As shown in FIG. 1, the electrode extensions 51a may be disposed over the region between the plates in the reflective metal layer 31 formed of the plurality of plates. Preferably, a width of the groove region of the reflective metal layer 31, for example, a width of a region between the plurality of plates is wider than that of the electrode extensions 51a. Therefore, it is possible to prevent current from intensively flowing directly below the electrode extension 51a.

Meanwhile, the top insulating layer 47 is interposed between the n-electrode pad 51 and the semiconductor stacked structure 30. It is possible to prevent current from directly flowing in the semiconductor stacked structure 30 from the n-electrode pad 51 by the top insulating layer 47. In particular, it is possible to prevent current from concentrating directly below the n-electrode pad 51. Further, the top insulating layer 47 covers the plurality of protrusions 25a and the fine cones 25b. In this case, when the top insulating layer 47 may have a convex shape along the protrusions 25a, it is possible to reduce the internal total reflection generated from the top surface of the insulating layer 47.

The top insulating layer 47 may also cover the side of the semiconductor stacked structure 30 to protect the semiconductor stacked structure 30 from external environment. In addition, the top insulating layer 47 may have openings that expose the semiconductor stacked structure 30 and the electrode extensions 51a may be disposed within the openings to contact the semiconductor stacked structure 30.

Figure 5:
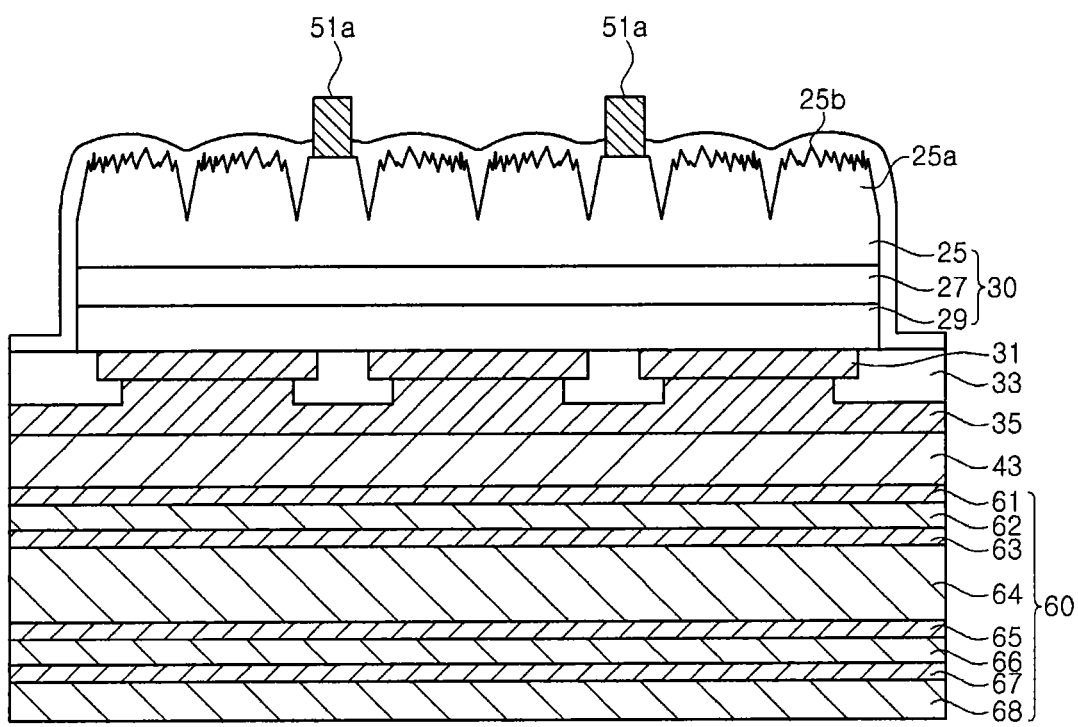
FIG. 5 is a cross-sectional view for describing a light emitting diode according to another exemplary embodiment of the present invention.

FIG. 5 is a cross-sectional view for describing a light emitting diode according to another embodiment of the present invention.

Referring to FIG. 5, the light emitting diode is approximately similar to the light emitting diode described with reference to FIGS. 1 to 4, but they are different from each other in that the support substrate 60 has a stacked structure of specific materials.

The support substrate 60 is configured to include a first metal layer 64 that is disposed at a center of the support substrate 60 and second metal layers 62 and 66 that are symmetrically disposed under and over the first metal layer 64. The first metal layer 64 may include at least one of, for example, tungsten (W) and molybdenum (Mo). The second metal layers 62 and 66 may be made of a material, for example, copper (Cu) having a thermal expansion coefficient higher than that of the first metal layer 64. Adhesive layers 63 and 65 are formed between the first metal layer 64 and the second metal layers 62 and 66. Further, an adhesive layer 61 is also formed between the bonding metal 43 and the second metal layer 62. These adhesive layers 61, 63, and 65 may include at least one of Ni, Ti, Cr, and Pt. In addition, a bottom surface of the second metal layer 66 that is disposed below the first metal layer 64 may be formed with the bottom bonding metal 68 through an adhesive layer 67. The bottom bonding metal 68 is symmetrical with the bonding metal 43 that is interposed between the support substrate 60 and the semiconductor stacked structure 30 and may be made of the same material as the bonding metal 43, for example, Au or Au—Sn (80/20 wt %). The bottom bonding metal 68 may be used to attach the support substrate 60 to electronic circuits or a PCB substrate.

In the exemplary embodiment of the present invention, the support substrate 60 has a structure including the first metal layer 64 and the second metal layers 62 and 66 that are symmetrically formed on the top and bottom surfaces of the first metal layer 64. For example, tungsten (W) or molybdenum (Mo) forming the first metal layer 64 has the relatively lower thermal expansion coefficient and the relatively higher strength than, for example, copper (Cu) forming the second metal layers 62 and 66. A thickness of the first metal layer 64 is formed to be thicker than that of the second metal layers 62 and 66. Therefore, forming the second metal layers 62 and 66 on the top and bottom surfaces of the first metal layer 64 is more preferable in terms of a process than having an opposite structure thereto (a structure in which the first metal layers are formed on the top and bottom surfaces of the second metal layer). In addition, in order for the support substrate 60 to have the thermal expansion coefficient similar to the thermal expansion coefficient of the growth substrate and the semiconductor stacked structure 30, the thickness of the first metal layer 64 and the thickness of the second metal layers 62 and 66 may be appropriately controlled.

The support substrate 60 is separately fabricated from the semiconductor stacked structure 30 and then, may be bonded to the barrier metal layer 35 through the bonding metal 43. The bonding metal 43 may be formed by eutectic bonding using, for example, Au or Au—Sn (80/20 wt %). Unlike this, the support substrate 60 may be formed by being plated or deposited on the barrier metal layer 35. For example, the support substrate 60 may be plated by an electrolytic plating scheme that educes metals using a rectifier and an electroless plating scheme that educes metals using a reducing agent and may be deposited by thermal deposition, electron beam evaporation, sputtering, chemical vapor deposition, and the like.

FIGS. 6 to 11 are cross-sectional views for describing a method of fabricating a light emitting diode according to an exemplary embodiment of the present invention. Herein, the cross-sectional diagrams correspond to cross-sectional views taken along the line A-A of FIG. 1.

Figure 6:
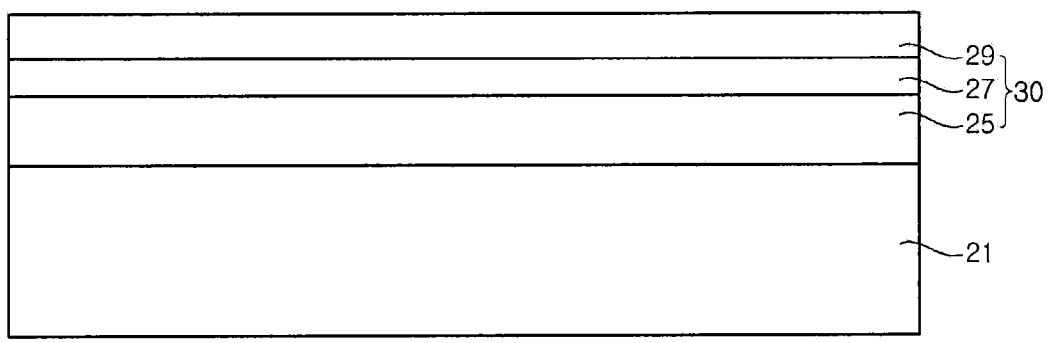
FIGS. 6 to 11 are cross-sectional views for a method of fabricating a light emitting diode according to an exemplary embodiment of the present invention, each of which is cross-sectional views corresponding to the line A-A of FIG. 1.

Referring to FIG. 6, the semiconductor stacked structure 30 that includes the n-type semiconductor layer 25, the active layer 27, and the p-type semiconductor layer 29 is formed on the gallium nitride substrate 21. The n-type and p-type semiconductor layers 25 and 29 are each formed in a single layer or a multilayer. In addition, the active layer 27 may be formed in a single quantum well structure or a multi quantum well structure. The semiconductor layers 25, 27, and 29 are grown on the gallium nitride substrate 21 and thus, may be formed to have the dislocation density of about $5 \times 10^6/cm^2$ or less.

The compound semiconductor layers may be formed of gallium nitride-based compound semiconductor, for example, (Al, Ga, In) N and may be grown on the substrate 21 by processes such as a metal organic chemical vapor deposition (MOCVD), molecular beam epitaxy (MBE), and the like.

Figure 7:
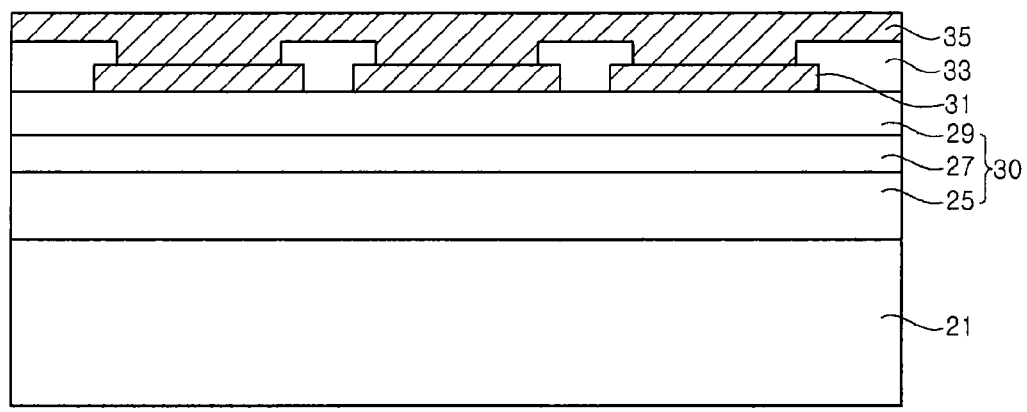

Referring to FIG. 7, the reflective metal layer 31 is formed on the semiconductor stacked structure 30. The reflective metal layer 31 has grooves that expose the semiconductor stacked structure 30. For example, the reflective metal layer 31 may be formed of a plurality of plates between which the grooves may be formed (see FIG. 1).

Then, the intermediate insulating layer 33 covering the reflective metal layer 31 is provided. The intermediate insulating layer 33 fills the grooves within the reflective metal layer and covers the side and the edge of the reflective metal layer. In addition, the intermediate insulating layer 33 has openings that expose the reflective metal layer 31. The intermediate insulating layer 33 may form the silicon oxide layer or the silicon nitride layer and may be formed of the distribution Bragg reflector in which the insulating layers having different refractive indexes are repeatedly stacked.

The barrier metal layer 35 is formed on the intermediate insulating layer 33. The barrier metal layer 35 may fill the openings formed in the intermediate insulating layer 33 to be connected to the reflective metal layer 31.

Figure 8:
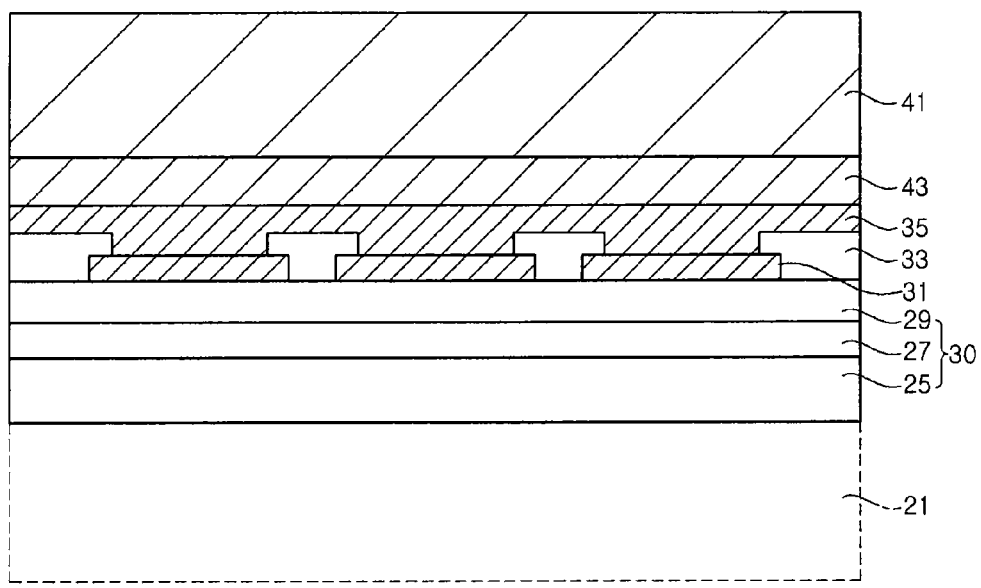

Referring to FIG. 8, the support substrate 41 is attached to the barrier metal layer 35. The support substrate 41 is separately fabricated from the semiconductor stacked structure 30 and then, may be bonded to the barrier metal layer 35 through the bonding metal 43. Unlike this, the support substrate 41 may be formed by being plated on the barrier metal layer 35.

Thereafter, the surface of the n-type semiconductor layer 25 of the semiconductor stacked structure 30 is exposed by removing the gallium nitride substrate 21.

When the conventional sapphire substrate is used as the growth substrate, the sapphire substrate has different physical properties from the semiconductor layers 25, 27, and 29 grown thereon, such that the sapphire substrate may be easily separated using the interface between the substrate and the semiconductor layers. However, when the gallium nitride substrate 21 is used as the growth substrate, the gallium nitride substrate 21 and the semiconductor layers 25, 27, and 29 grown thereon are made of the same kind of materials, such that it is difficult to separate the substrate 21 using the interface between the substrate 21 and the semiconductor layers 25, 27, and 29.

Therefore, the exemplary embodiment of the present invention uses a method of removing primarily the gallium nitride substrate 21 by grinding and then, precisely removing it by using an inductively coupled plasma reactive ion etching (ICP-RIE) technology. In addition, polishing such as chemical mechanical polishing (CMP) in addition to the grinding may be performed and then, the gallium nitride substrate 21 may be removed using the reactive ion etching technology.

Further, a test to confirm whether the n-type compound semiconductor layer 25 is exposed may be performed. For example, the surface resistance of the surface exposed after the grinding, the polishing, or the reactive ion etching process can be measured and whether the n-type compound semiconductor layer 25 is exposed may be confirmed by measuring the surface resistance.

Figure 9:
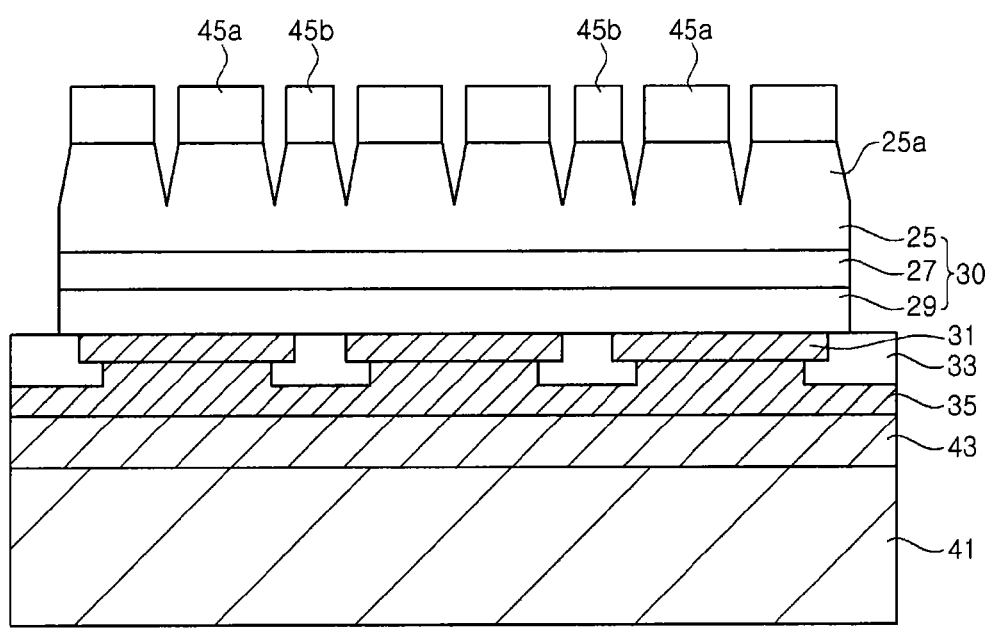

Referring to FIG. 9, mask patterns 45a and 45b are formed on the exposed n-type semiconductor layer 25. The mask pattern 45a covers the region of the n-type semiconductor layer 25 corresponding to the protrusions 25a and the mask pattern 45b covers the region of the n-type semiconductor layer 25 corresponding to the groove of the reflective metal layer 31. The mask pattern 45a may be arranged in a honeycomb shape. Meanwhile, the mask pattern 45b covers the region in which the n-electrode pads and the electrode extensions are formed in the future. The mask patterns 45a and 45b may be made of polymer such as photoresist, but is not limited thereto and therefore, may be made of silicon oxide.

The n-type semiconductor layer 25 is etched using the mask patterns 45a and 45b as an etch mask. Therefore, the plurality of protrusions 25a are formed and the V-shaped groove is formed between the protrusions 25a. The protrusions 25a may have an average height of 3 µm or more and has a height smaller than the thickness of the n-type semiconductor layer 25. To this end, the n-type semiconductor layer 25 preferably has a thickness of 4 µm or more. The n-type semiconductor layer 25 may be etched using, for example, a dry etching technology such as the reactive ion etching.

Figure 10:
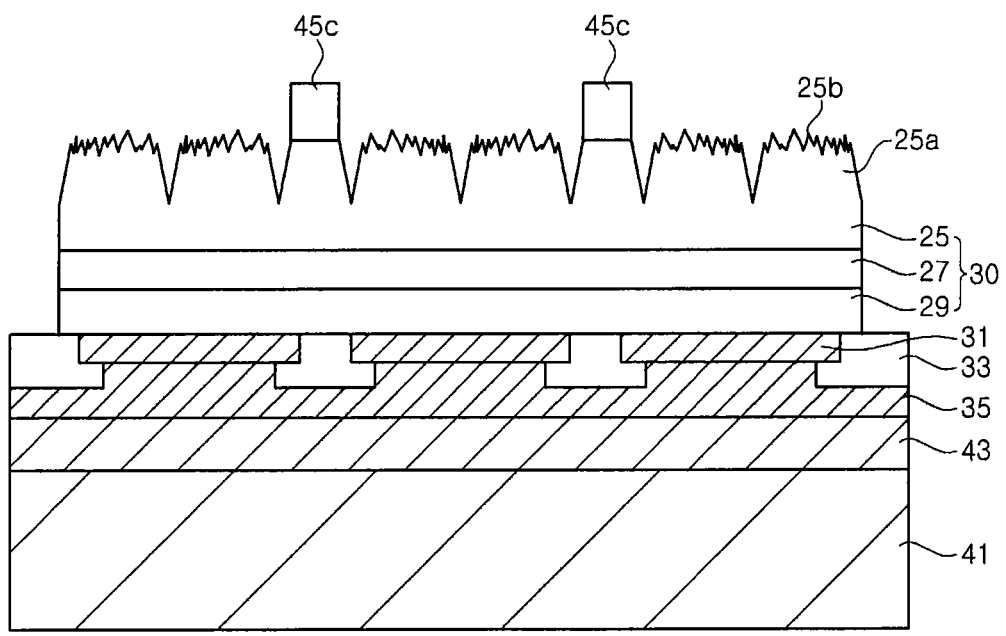

Referring to FIG. 10, after the mask patterns 45a and 45b are removed, the mask pattern 45c is formed. The mask pattern 45c is formed at a position of the mask pattern 45b, which covers a region in which the n-electrode pads and the electrode extensions are formed in the future.

Then, the fine cones 25b are formed on the top surfaces of the protrusions 25a by performing wet etching on the surface of the n-type semiconductor layer 25. The wet etching may be performed using a boiling solution of KOH or NaOH, such that the fine cones having an average height of 1 µm or less may be formed.

Generally, the cones exceeding 1 µm are formed by etching an N-face using the photoelectrochemical (PEC) etching technology. However, the semiconductor layers grown on the gallium nitride substrate have very slight defects such as dislocation, such that it is difficult to form the cones using the PEC technology. On the other hand, the cones of at least 1 µm or less may be formed by using the boiling solution of KOH or NaOH.

Thereafter, the mask pattern 45c is removed and the surface of the n-type semiconductor layer 25 on which the mask pattern 45c is disposed maintains the flat surface.

Meanwhile, a chip division region is formed by patterning the semiconductor stacked structure 30 and the intermediate insulating layer 33 is exposed. The chip division region may be formed before or after the protrusions 25a or the fine cones 25b are formed.

Figure 11:
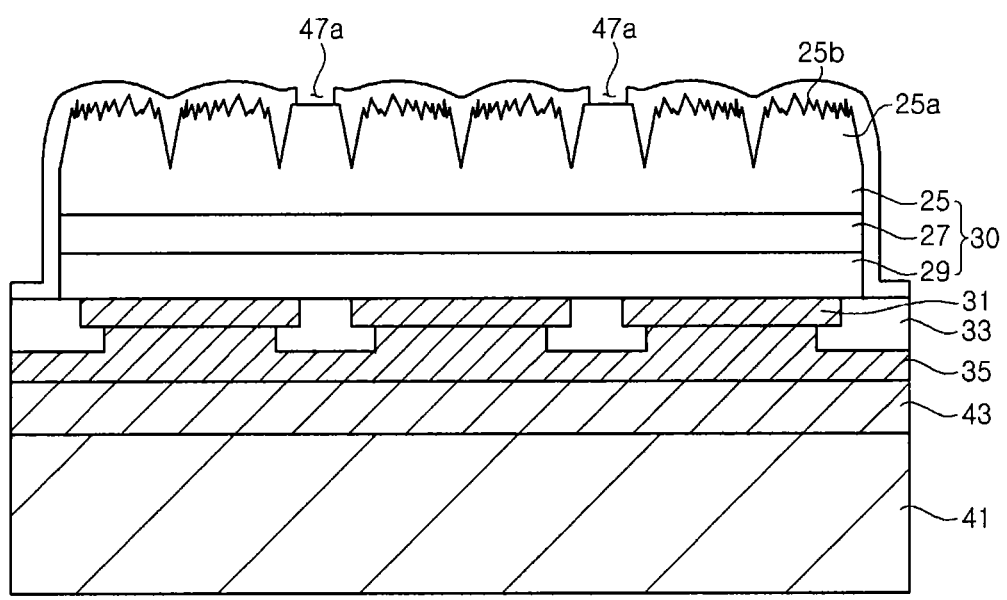

Referring to FIG. 11, the top insulating layer 47 is formed on the n-type semiconductor layer 25 on which the protrusions 25a and the fine cones 25b are formed. The top insulating layer 47 is formed along the protrusions 25a and thus, has a convex surface. The top insulating layer 47 covers the flat surface on which the n-electrode pads 51 are formed. The top insulating layer 47 may also cover the side of the semiconductor stacked structure 30 exposed to the chip division region. However, the top insulating layer 47 has the openings 47a exposing the flat surface on which the electrode extensions 51a are formed.

Next, the n-electrode pads 51 are formed on the top insulating layer 47 and the electrode extensions are formed within the openings 47a. The electrode extensions extend from the n-electrode pads 51 and thus, are electrically connected to the semiconductor stacked structure 30.

Thereafter, the light emitting diode is completed by being divided into individual chips along the chip division region (see FIG. 2).

Figure 12:
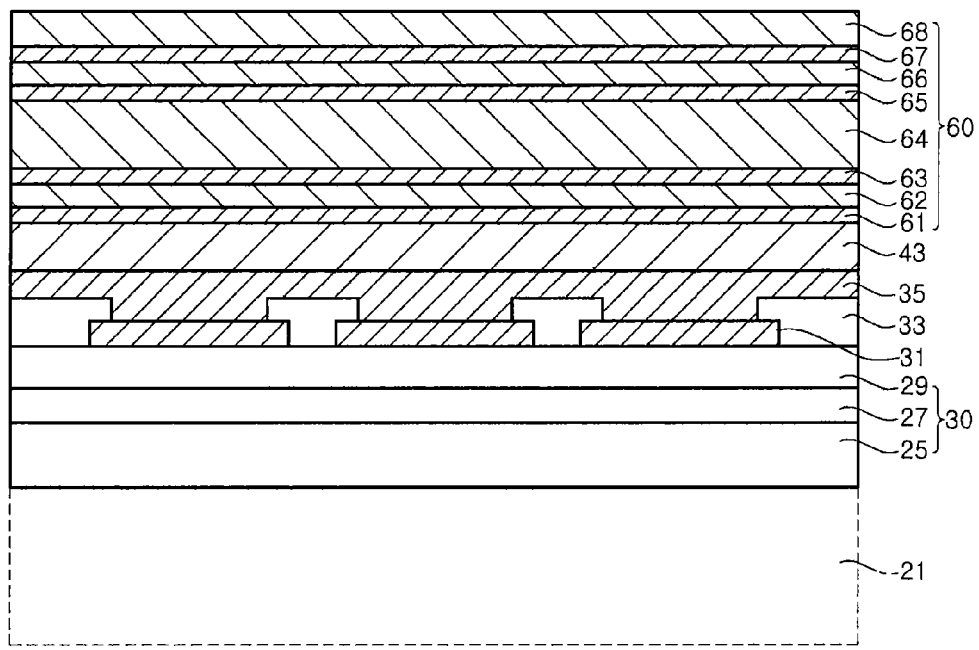
FIG. 12 is a cross-sectional view for describing a light emitting diode according to another exemplary embodiment of the present invention.

FIG. 12 is a cross-sectional view for describing the method of fabricating a light emitting diode of FIG. 5.

Referring to FIG. 12, the method of fabricating a light emitting diode according to the exemplary embodiment of the present invention is similar to the method of fabricating a light emitting diode described with reference to FIGS. 6 to 11, but they are different from each other in that the support substrate 60 is formed of a specific material and structure.

As described in reference with FIG. 6, the semiconductor stacked structure 30 that includes the n-type semiconductor layer 25, the active layer 27, and the p-type semiconductor layer 29 is formed on the gallium nitride substrate 21. Thereafter, referring to FIG. 7, the reflective metal layer 31, the bottom insulating layer 33, and the barrier metal layer 35 are formed on the semiconductor stacked structure 30.

Next, the support substrate 60 is attached to the barrier metal layer 35. The support substrate 60 is separately manufactured from the semiconductor stacked structure 30 and then, may be bonded to the barrier metal layer 35 through the bonding metal 43.

As described in reference with FIG. 5, the support substrate 60 includes the first metal layer 64 that is disposed at the center of the support substrate 60 and second metal layers 62 and 66 that are symmetrically disposed under and over the first metal layer 64. The first metal layer 64 may include at least one of, for example, tungsten (W) and molybdenum (Mo). The second metal layers 62 and 66 may be made of a material, for example, copper (Cu) having a thermal expansion coefficient higher than that of the first metal layer 64. The adhesive layers 63 and 65 are formed between the first metal layer 64 and the second metal layers 62 and 66. Further, the adhesive layer 61 is also formed between the bonding metal 43 and the second metal layer 62. These adhesive layers 61, 63, and 65 may include at least one of Ni, Ti, Cr, and Pt. In addition, the bottom surface of the second metal layer 66 may be formed with the bottom bonding metal 68 through the adhesive layer 67. The bottom bonding metal 68 may be used to attach the support substrate 60 to electronic circuits or a PCB substrate.

In the exemplary embodiment of the present invention, the support substrate 60 has a structure including the first metal layer 64 and the second metal layers 62 and 66 that are symmetrically formed on the top and bottom surfaces of the first metal layer 64. For example, tungsten (W) or molybdenum (Mo) forming the first metal layer 64 has the relatively lower thermal expansion coefficient and the relatively higher strength than, for example, copper (Cu) forming the second metal layers 62 and 66. The thickness of the first metal layer 64 is formed to be thicker than that of the second metal layers 62 and 66. In addition, in order for the support substrate 60 to have the thermal expansion coefficient similar to the thermal expansion coefficient of the growth substrate and the semiconductor stacked structure 30, the thickness of the first metal layer 64 and the thickness of the second metal layers 62 and 66 may be appropriately controlled.

In the thermal process according to the bonding of the support substrate 60 or the following process by the structure of the support substrate 60, a stress due to a difference in the thermal expansion coefficient among the gallium nitride substrate 21, the semiconductor stacked structure 30, and the support substrate 60 can be efficiently reduced, which leads to the suppression of the damage and warpage phenomenon of the compound semiconductor layer.

In order to bond the support substrate 60, high-temperature atmosphere is needed and in order to facilitate the bonding, pressure may be applied. The pressure may be applied only during the bonding process using a pressure applying plate that is disposed above a high-temperature chamber and the pressure may be removed after the bonding.

Alternatively, the pressure may be applied by a holder that fixes the support substrate 60 and the growth substrate 21 at both sides thereof and thus, the pressure may be separately applied from the chamber of the high-temperature atmosphere. Therefore, after the support substrate 60 is bonded, the pressure may be maintained at normal temperature.

Unlike this, the support substrate 60 may also be formed over the barrier metal layer 35 by, for example, the plating technology.

As described in reference with FIG. 8, the support substrate 60 is formed and then, the gallium nitride substrate 21 is removed, such that the surface of the n-type semiconductor layer 25 of the semiconductor stacked structure 30 is exposed. Then, as described in reference with FIGS. 9 to 11, the plurality of protrusions 25a and the fine cones 25b are formed and the top insulating layer 47, the n-electrode pads 51, and the electrode extensions 51a are formed and are divided into the individual chips, such that the light emitting diode of FIG. 5 is completed.

FIGS. 13 and 14 show the section and plane SEM images that show the protrusions and the fine cones fabricated according to the exemplary embodiments of the present invention.

Referring to FIGS. 13 and 14, the plurality of protrusions 25a have a truncated cone shape. The protrusions 25a may have a truncated cone shape of which the bottom surface is a hexagon and the top surface is approximately a circle. The protrusion 25a may be arranged in a honeycomb shape and the protrusions 25a are adjacent to each other and thus, the V-shaped groove may be formed in the region between the protrusions 25a.

Meanwhile, the top surface of the protrusions 25a is formed with the fine cones 25b. The fine cones 25b are not necessarily limited thereto, but may be disposed only on the top surface of the protrusions 25a.

Figure 15:
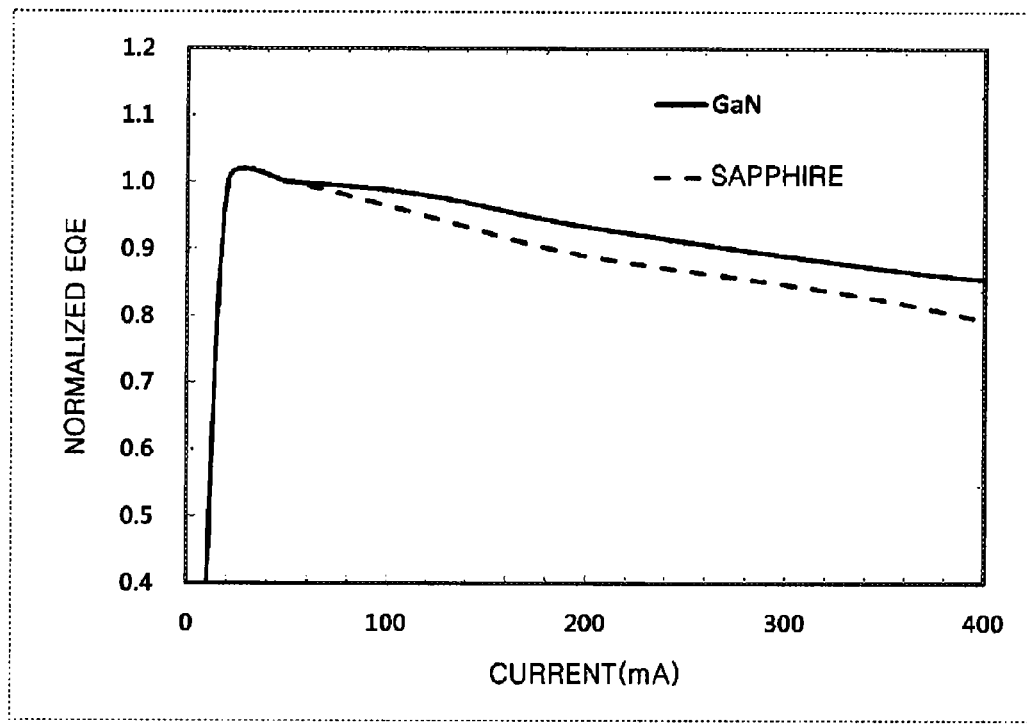
FIG. 15 is a graph for describing droops of a semiconductor stacked structure grown on the sapphire substrate according to the related art and a semiconductor stacked structure grown on a gallium nitride substrate according to the exemplary embodiment of the present invention.

FIG. 15 shows a graph for describing droops of a semiconductor stacked structure grown on the sapphire substrate according to the related art and a semiconductor stacked structure grown on a gallium nitride substrate according to the exemplary embodiment of the present invention. The light emitting diode having a size of 350 μm×350 μm is fabricated to measure the optical power and a change in external quantum efficiency according to current using the measured value is standardized and represented. Current is applied in a pulse form and thus, the optical power is measured at each current. The droop is represented by a value of the reduced external quantum efficiency with respect to maximum external quantum efficiency.

Referring to FIG. 15, the semiconductor stacked structure grown on the sapphire substrate or the semiconductor stacked structure grown on the gallium nitride substrate does not show a significant difference in the optical power while current is increased to about 40 mA but shows the increase in a difference in the optical output while current exceeds 40 mA. As a result of calculating the droop at current of 350 mA, the semiconductor stacked structure grown on the sapphire substrate shows the droop of about 27% (−0.27) but the semiconductor stacked structure grown on the gallium nitride substrate shows the droop of about 17% (−0.17).

Therefore, the light emitting diode having the vertical structure using the semiconductor stacked structure grown on the gallium nitride substrate is fabricated, thereby providing the light emitting diode showing the droop less than 20%.

According to the exemplary embodiments of the present invention, the semiconductor stacked structure having the low dislocation density can be formed by growing the semiconductor layers using the gallium nitride substrate as the growth substrate. Further, the high efficiency light emitting diode can be implemented by fabricating the light emitting diode having the vertical structure by removing the gallium nitride substrate from the semiconductor stacked structure. In addition, the semiconductor layers grown on the gallium nitride substrate have the very low dislocation density to have a limitation in providing a roughed surface only using the photoelectrochemical etching, which makes it difficult to improve the light extraction efficiency. However, according to the exemplary embodiment of the present invention, the light extraction efficiency of the semiconductor stacked structure can be improved.

Figure 16:
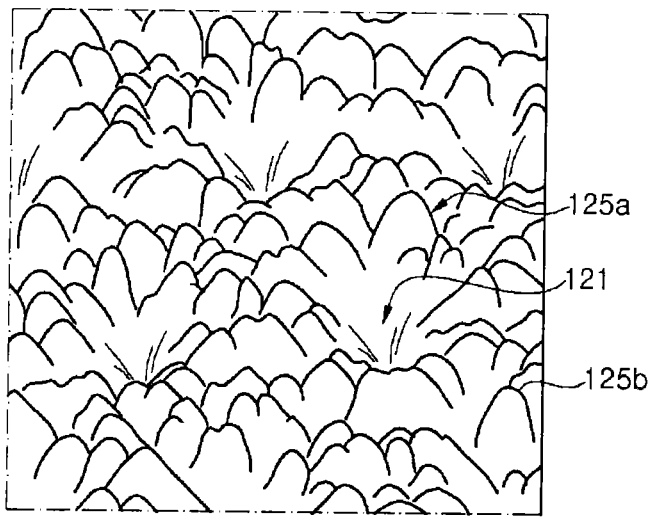
FIGS. 16a, 16b and 16c are a prospectional view of a surface of a semiconductor stacked structure, a plane-view SEM image and a cross-sectional view of the semiconductor stacked structure according to another embodiment of the present invention.
Figure 16:
Figure 16:
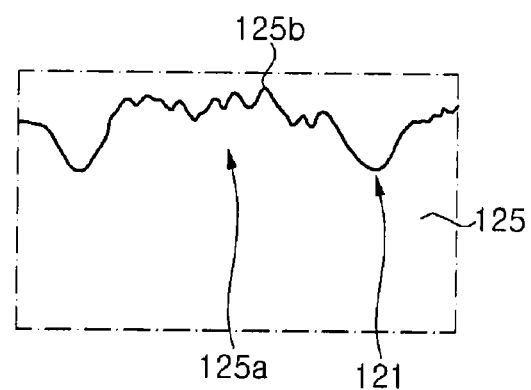

FIGS. 16a, 16b and 16c are a prospective view of a surface of a semiconductor stacked structure, a plane-view SEM image and a cross-sectional view of a n-type semiconductor layer 125 of the semiconductor stacked structure according to another embodiment of the present invention, respectively.

In the previous embodiments, it has been described that the protrusions 25a having a truncated shape are spaced apart from one another and fine cones 25b are formed on the top surfaces of the protrusions 25a. On the contrary, in this embodiment, recesses 121 are spaced apart from one another, and a protruding portion 125a that is a region between the recesses 121 are continuously connected. That is, a protruding portion 125a is formed continuously by the recesses 121 and fine cones 125b are formed on the protruding portion 125a. In addition, each of the recesses may be formed with a cone shape.

Various embodiments and features have been described, but the present invention is not limited to the foregoing embodiments and features and may be variably modified, without departing from the spirit or scope of the present invention.

The invention claimed is:

1. A light emitting diode, comprising:
   a support substrate;
   a semiconductor stacked structure disposed on the support substrate, comprising:
   a gallium nitride-based p-type semiconductor layer having a dislocation density of $5\times10^6/cm^2$ or less,
   a gallium nitride-based active layer having a dislocation density of $5\times10^6/cm^2$ or less, and
   a gallium nitride-based n-type semiconductor layer having a dislocation density of $5\times10^6/cm^2$ or less; and
   a reflecting layer disposed between the support substrate ark :he semiconductor stacked structure,
   wherein
   the semiconductor stacked structure comprises a plurality of protrusions having a truncated cone shape and fine cones formed on top surfaces of the protrusions, and
   a droop of the light emitting diode is less than 20% at 350 mA.

2. The light emitting diode of claim 1, wherein each of the gallium nitride-based p-type semiconductor layer, the gallium nitride-based active layer and the gallium nitride-based n-type semiconductor layer is grown on a gallium nitride substrate.

3. The light emitting diode of claim 1, wherein the protrusions are arranged in a honeycomb shape.

4. The light emitting diode of claim 1, wherein the protrusions having the truncated cone shape are adjacent to each other and thus, a V-shaped groove of which the bottom is sharp is formed in a region therebetween.

5. The light emitting diode of claim 4, wherein the bottom surfaces of the protrusions have a hexagonal shape.

6. The light emitting diode of claim 1, wherein an average height of the protrusions exceeds 3 μm and an average height of the fine cones is 1 μm or less.

7. The light emitting diode of claim 1, wherein the fine cones are disposed only on the top surfaces of the protrusions.

8. A method of fabricating the light emitting diode of claim 1, comprising;
   forming a semiconductor stacked structure by growing semiconductor layers including a gallium nitride-based n-type semiconductor layer, a gallium nitride-based active layer, and a gallium nitride-based p-type semiconductor layer on a gallium nitride substrate;
   forming a support substrate on the semiconductor stacked structure; and
   removing the gallium nitride substrate.

9. The method of claim 8, further comprising: forming a plurality of protrusions having fine cones by etching a surface of the semiconductor stacked structure that is exposed by removing the gallium nitride substrate, wherein the plurality of protrusions have a truncated cone shape.

10. The method of claim 9, wherein the forming of plurality of protrusions having the fine cones includes:
    forming a mask pattern on the surface of the semiconductor stacked structure and performing dry etching on the semiconductor stacked structure by using the mask pattern as an etch ask to form the plurality of protrusions;
    removing the mask pattern; and
    forming fine cones by performing wet etching on the top surfaces of the plurality of protrusions.

11. The method of claim 10, wherein the wet etching is performed using a boiling solution of KOH or NaOH.

12. The method of claim 10, wherein a V-shaped groove of which the bottom is sharp is formed in a region between the protrusions so that the plurality of protrusions are adjacent to each other.

13. The method of claim 8, wherein the removing of the gallium nitride substrate includes:
    removing a portion of the gallium nitride substrate by grinding the gallium nitride substrate; and
    removing a portion of the gallium nitride substrate remaining on the semiconductor stacked structure by an inductively coupled plasma reactive ion etching technology.

14. The method of claim 13, further comprising: polishing the gallium nitride substrate after grinding the gallium nitride substrate.

15. The method of claim 13, further comprising: performing a test to confirm whether the surface of the semiconductor stacked structure is exposed.

16. The method of claim 15, wherein the test is performed by measuring surface resistance of the surface of the semiconductor stacked structure.

17. A light emitting diode, comprising:
    a support substrate;
    a semiconductor stacked structure disposed on the support substrate' comprising:
    a gallium nitride-based p-type semiconductor layer having a dislocation density of from $1\times10^4/cm^2$ to $5\times10^6/cm^2$,
    a gallium nitride-based active layer having a dislocation density of from $1\times10^4/cm^2$ to $5\times10^6/cm^2$, and
    a gallium nitride-based n-type semiconductor layer having a dislocation density of from $1\times10^4/cm^2$ to $5\times10^6/cm^2$; and
    a reflecting layer disposed between the support substrate and the semiconductor stacked structure, wherein
    the semiconductor stacked structure comprises a plurality of protrusions and fine cones formed on top surfaces of the protrusions, and
    a droop of the light emitting diode is less than 20% at 350 mA.

18. A light emitting diode, comprising:
    a support substrate;
    a semiconductor stacked structure disposed on the support substrate, comprising: a gallium nitride-based p-type semiconductor layer having a dislocation density of from $1\times10^4/cm^2$ to $5\times10^6/cm^2$,
    a gallium nitride-based active layer having a dislocation density of from $1\times10^4/cm^2$ to $5\times10^6/cm^2$, and
    a gallium nitride-based n-type semiconductor layer having a dislocation density of from $1\times10^4/cm^2$ to $5\times10^6/cm^2$; and
    a reflecting layer disposed between the support substrate and the semiconductor stacked structure,
    wherein the semiconductor stacked structure includes a plurality of recesses spaced apart from one another and fine cones formed on surfaces of a protruding portion between the recesses, and
    a droop of the light emitting diode is less than 20% at 350 mA.

* * * * *